United States Patent [19]
Matsumoto et al.

[11] Patent Number: 5,990,706
[45] Date of Patent: Nov. 23, 1999

[54] LOGIC CIRCUIT AND METHOD OF DESIGNING THE SAME

[75] Inventors: Nobu Matsumoto; Kimiyoshi Usami, both of Tokyo; Jun-ichi Tsujimoto, Tokoy, all of Japan

[73] Assignee: Kabushiki Kaisha Toshiba, Kawasaki, Japan

[21] Appl. No.: 08/827,506

[22] Filed: Mar. 28, 1997

[30] Foreign Application Priority Data

Mar. 29, 1996 [JP] Japan ................................. 8-076992

[51] Int. Cl.$^6$ ................................. H03K 19/096
[52] U.S. Cl. ................................. 326/98; 326/81; 326/97; 326/121
[58] Field of Search ................. 326/80–81, 95–98, 326/112, 119, 121, 68, 63

[56] References Cited

U.S. PATENT DOCUMENTS

| | | | |
|---|---|---|---|
| 3,778,782 | 12/1973 | Kitagawa | 326/95 |
| 3,935,474 | 1/1976 | Komarek | 326/96 |
| 3,943,377 | 3/1976 | Suzuki | 326/98 |
| 5,103,121 | 4/1992 | Wendell et al. | 307/475 |
| 5,378,942 | 1/1995 | Wu et al. | 326/97 |
| 5,490,119 | 2/1996 | Sakurai et al. | 326/121 |
| 5,804,988 | 9/1998 | Uchida | 326/81 |

FOREIGN PATENT DOCUMENTS

| | | |
|---|---|---|
| 2-198099 | 8/1990 | Japan . |
| 4-168805 | 6/1992 | Japan . |
| 4-227318 | 8/1992 | Japan . |

*Primary Examiner*—Jon Santamauro
*Assistant Examiner*—Don Phu Le
*Attorney, Agent, or Firm*—Foley & Lardner

[57] ABSTRACT

A CMOS logic circuit consists of a domino gate serving as a logic gate 1 not disposed on a critical path and operating on a lower supply voltage (VDDL) and another domino gate serving as a logic gate 2 operating on a higher supply voltage (VDDH). An output of the logic gate 1 is an input to the logic gate 2. No level converter is arranged between the logic gates 1 and 2, and therefore, the power dissipation of the CMOS logic circuit is small. The CMOS logic circuit is designed according to a method that satisfies timing requirements and maximizes the number of logic gates that operate on the lower supply voltage (VDDL).

21 Claims, 10 Drawing Sheets

LOGIC CIRCUIT AND METHOD OF DESIGNING THE SAME

BACKGROUND OF THE INVENTION

1. Field of the Invention

The present invention relates to a logic circuit of low power dissipation adopted for a large-scale integrated circuit, to a computer system employing the logic circuit, and to a method of designing the logic circuit.

2. Description of the Prior Art

CMOS logic circuits play an important role in integrated circuits because they basically pass no DC current. The power requirement of CMOS logic circuits, although once thought comparatively low, is rapidly becoming a major concern in design of personal information systems and large computer. The power dissipation $P_d$ of a CMOS logic circuit is a dynamic loss, or the power dissipation $P_d$ is mainly caused when charging and discharging load, and is proportional to a square of a high level source voltage $V_{DD}$ supplied to the circuit as follows:

$$P_d \propto \frac{1}{2} C \cdot V_{DD}^2 \tag{1}$$

where C is the effective capacitance per gate. The CMOS logic circuits usually operate between a high level source voltage and a low level source voltage such as a ground (GND) voltage. As is apparent in the expression (1), the power dissipation $P_d$ effectively decreases if the high level source voltage $V_{DD}$ is scaled down. Lowering of the high level source voltage $V_{DD}$, however, has drawbacks such as decreasing the drift velocity of electrons in transistors and decreasing a drain current of the transistors. By such drawbacks, the lowering of the high level source voltage $V_{DD}$ increases a gate delay time and deteriorates the performance of the logic circuit.

Figure 1A:
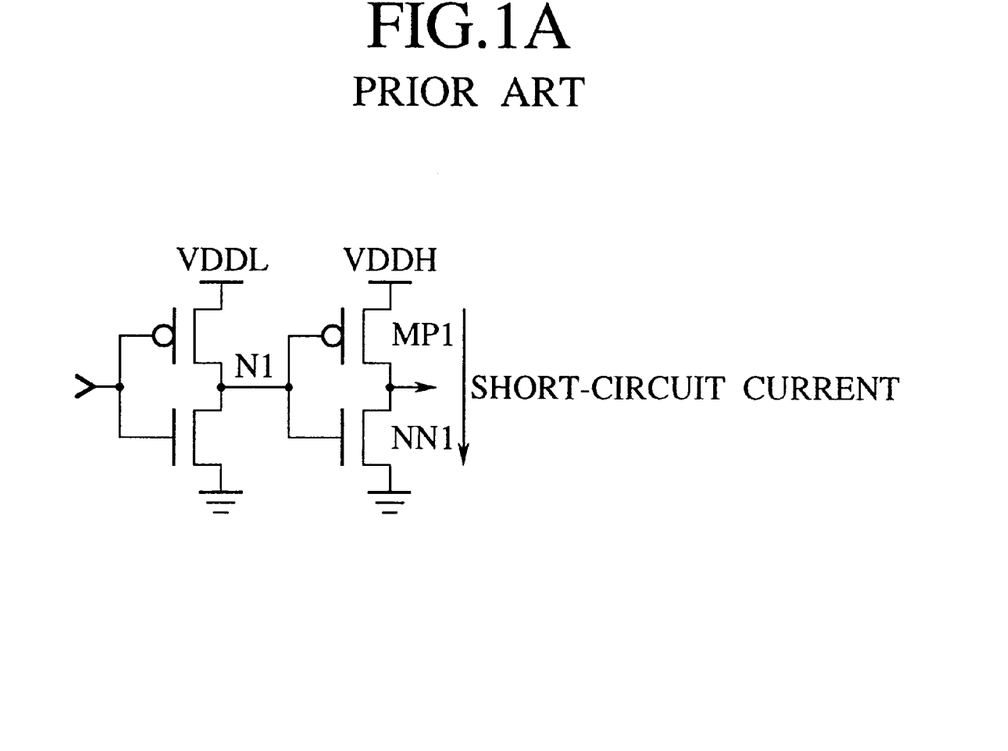
FIG. 1A explains a short-circuit current (DC current) flowing through a second CMOS inverter operating on a second high level source voltage (VDDH) and connected to a first CMOS inverter operating on a first high level source voltage (VDDL), according to a prior art.

Now, a logic circuit having CMOS gates operating with different supply voltages is reviewed as an example of the art for minimization of the power dissipation. FIG. 1A shows a CMOS logic circuit consisting of first and second CMOS inverters according to a prior art. The first CMOS inverter operates on a lower supply voltage VDDL and the second CMOS inverter on a higher supply voltage VDDH. The first and second inverters are directly connected to each other, and if a node N1 between the first and second inverters is at the lower supply voltage VDDL and if VDDL<VDDH–|Vthp|, a p-channel MOS transistor MP1 of the second inverter is not completely turned off to thereby generate a short-circuit current (or DC current) through the second inverter. In this specification, "Vthp" represents the threshold voltage of a pMOS, "Vthn" the threshold voltage of an nMOS, "pMOS" a p-channel MOS transistor, and "nMOS" an n-channel MOS transistor.

Since the pMOS MP1 is incompletely turned off, the short-circuit current flows from a power supply of the higher supply voltage VDDH toward a ground through the second inverter. If the first inverter operates on the higher supply voltage VDDH and the second inverter on the lower supply voltage VDDL contrary to the case of FIG. 1A, no short-circuit current will flow through the second inverter. This is because an input voltage to the second inverter is the higher supply voltage VDDH to completely turn off the pMOS MP1 of the second inverter.

Figure 1B:
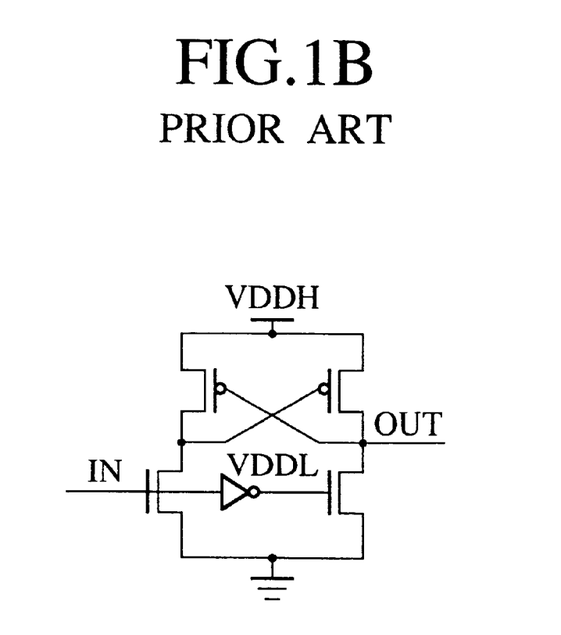
FIG. 1B shows a level converter according to the prior art.

FIG. 1B shows a level converter interposed between gates operating on different supply voltages in a CMOS logic circuit, to prevent the short-circuit current and reduce power dissipation. Although the level converter blocks the short-circuit current, it consumes relatively large dynamic power when it carries out a switching operation. If the CMOS logic circuit must have many level converters, the power dissipation thereof will increase.

Figure 2A:
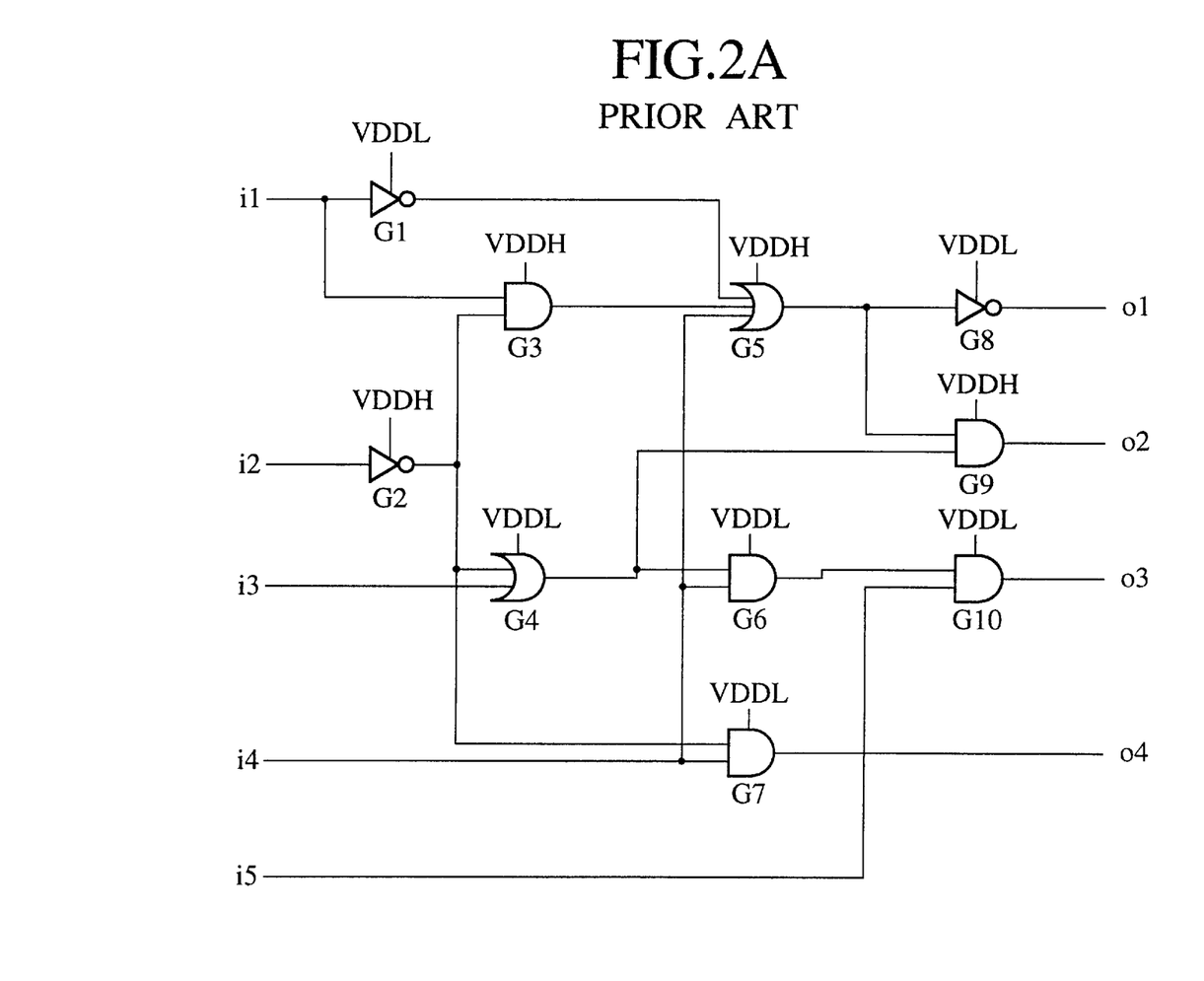
FIG. 2A shows a logic circuit containing a mixture of logic gates operating on two different high level source voltages according to the prior art.

FIG. 2A shows a CMOS logic circuit according to the prior art. The expression (1) tells that lowering the high level source voltage $V_{DD}$ is effective to reduce the power dissipation of a CMOS logic circuit. It is impossible, however, to drop the high level source voltage of every gate in the CMOS circuit because it will make some gates involved in critical paths unable to secure timing requirements. If the timing requirements are not secured, the total operation speed of the circuit will drop. In FIG. 2A, some gates that are not involved in critical paths are selected and set to operate on a lower supply voltage VDDL. To achieve this, the level converter of FIG. 1B must be interposed between a gate operating on the lower supply voltage VDDL and a gate operating on a higher supply voltage VDDH, to prevent a short-circuit current, in practice.

Figure 2B:
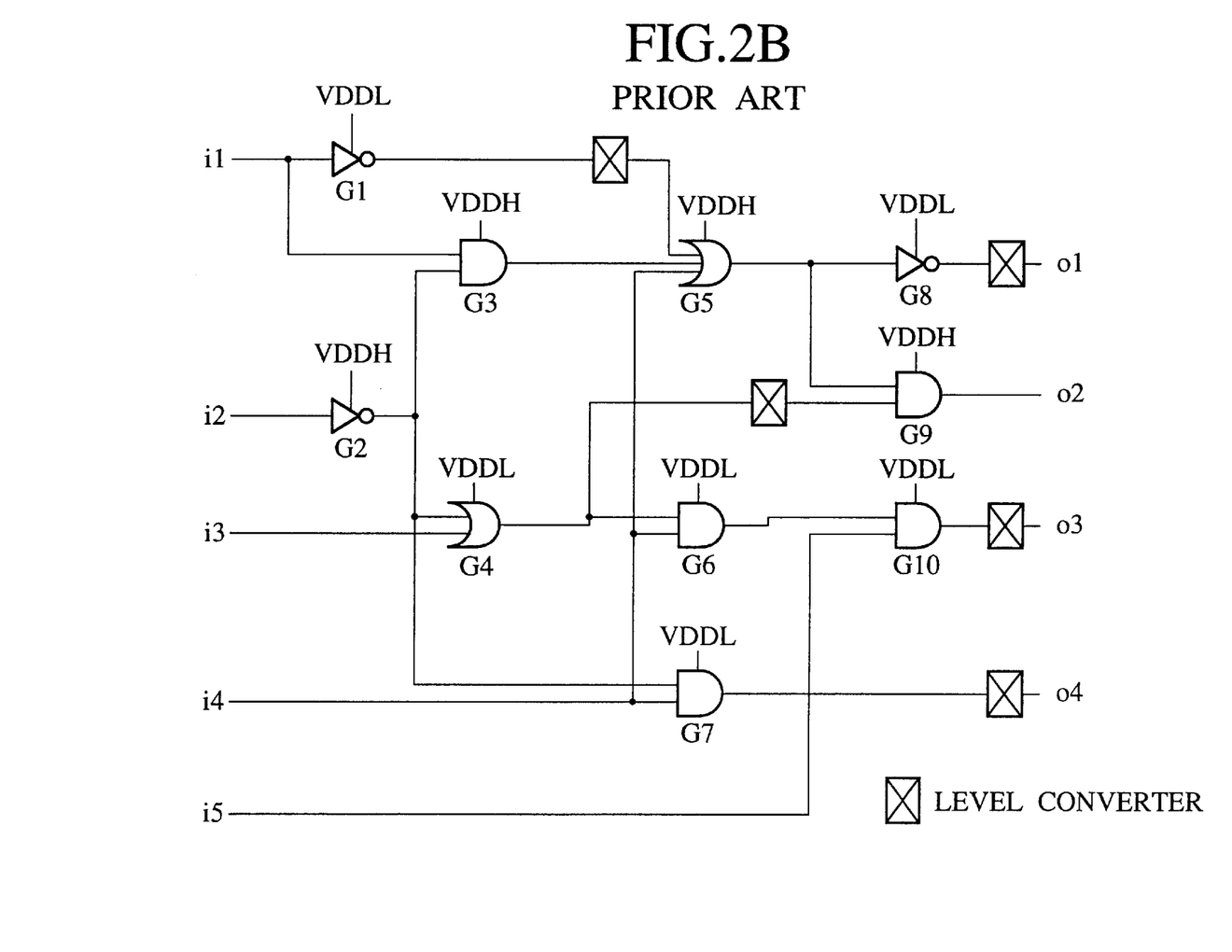
FIG. 2B shows a modification of the logic circuit of FIG. 2A provided further with level converters according to the prior art.

From this point, FIG. 2B shows the modified CMOS logic circuit of FIG. 2A provided with the level converters. In the circuit, some gates operate on the higher supply voltage VDDH and the others on the lower supply voltage VDDL. The number of the level converters used for these gates is large to dissipate large power, and therefore, the circuit of FIG. 2B is undesirable in terms of power dissipation.

Techniques about level converters and arts for reducing power consumption and power dissipation are disclosed in Japanese Unexamined Patent Publication (JUPP) Nos. 4-168805, 4-227318, and 2-198099. The JUPP 4-168805 discloses a dynamic level shifter that passes no short-circuit current. The level shifter carries out a sampling operation according to a clock signal and employs a cross-linked dynamic sense circuit, to reduce power dissipation and secure a high-speed operation. The JUPP 4-227318 discloses a BiCMOS buffer circuit by which an ECL level signal (lower voltage level such as from –0.9 to –1.7 Volts) is converted into a CMOS level signal (higher voltage level signal such as from 0 to 5 Volts) as quickly as possible. The JUPP 2-198099 discloses a vertical ROM (dynamic ROM) incorporating a power source clamp made of a differential amplifier and an FET. A lowered voltage (3V) by the power source clamp is used to precharge a memory array and as a source voltage for a level converter disposed after the memory array. The output of the level converter is transmitted to an external circuit operating with a higher voltage (5V). This technique improves a read speed without increasing a circuit scale or power consumption.

As mentioned above, a CMOS logic circuit may be preferred to have mixed gates operating on a lower supply voltage VDDL and gates operating on a higher supply voltage VDDH. However, any gate operating on VDDH and connected after the gate operating on VDDL generates a short-circuit current. To prevent the short-circuit current, the level converter must be arranged between them. The level converter dissipates relatively large power. If the circuit must have many level converters, the power dissipation thereof will increase to nullify the effort of decreasing power dissipation by using the two supply voltages VDDL and VDDH. As a result, the prior arts hardly reduce the power dissipation of CMOS logic circuits.

SUMMARY OF THE INVENTION

An object of the present invention is to provide a logic circuit consisting of a mixture of logic gates operating on at least two different high level source voltages and having no level converters.

Another object of the present invention is to provide a logic circuit operating at high speed and low power dissipation.

Still another object of the present invention is to provide a computer system such as an MPU having the logic circuit operating at high speed and low power dissipation.

Still another object of the present invention is to provide a method of designing a logic circuit that meets timing requirements (restriction), operates at high speed, and dissipates small power.

In order to accomplish the objects, a first aspect of the present invention provides a logic circuit having at least a first and a second logic gates. A first domino gate serving as the first logic gate operates between a first high level source voltage VDDL and a low level source voltage. A second domino gate serving as the second logic gate operates between a second high level source voltage VDDH that is higher than VDDL and the low level source voltage. The first logic gate has a first precharge pMOS, a first input circuit, and a first CMOS inverter. The first input circuit is disposed between the first pMOS and a reference voltage source or the low level source voltage. The first CMOS inverter has an input terminal connected to a node between the first pMOS and the first input circuit. The second logic gate has a second precharge pMOS, a second input circuit, and a second CMOS inverter. The second input circuit is disposed between the second pMOS and the reference voltage source (the low level source voltage). The second CMOS inverter has an input terminal connected to a node between the second pMOS and the second input circuit. For convenience'sake, the supply voltages for the logic gates (or the domino gates) are only concerned with the high level source voltages, and the low level source voltage may be omitted from the discussion hereinafter.

The output of the first logic gate is connected to the second input circuit. The gate-source $V_{GS}$ of the second pMOS is never biased deeper than the gate threshold |Vthp| thereof. Although the first logic gate operating on VDDL is directly connected to the second logic gate operating on VDDH without a level converter interposing between them, no short-circuit current flows through the second logic gate. The first aspect makes logic gates that are not involved in critical paths operate on the first high level source voltage VDDL, thereby reducing power dissipation while securing an operation speed.

The CMOS logic circuit of the first aspect may have a clock buffer for providing the first and second logic gates with first and second clock signals, respectively. The clock buffer uses a single reference (input) clock signal to generate the first clock signal whose high level is defined by the first high level source voltage VDDL and the second clock signal whose high level is defined by the second high level source voltage VDDH. Using the single reference clock signal to generate the first and second clock signals reduces the load capacitance of clock wiring, thereby dropping power dissipation. Generating the first clock signal with the use of a lower supply voltage (the first high level source voltage VDDL) also helps reduce power dissipation in the clock wiring.

A second aspect of the present invention provides a method of designing the logic circuit of the first aspect. The method prepares first and second cell libraries. The first cell library stores information about cells corresponding to domino gates operating on the first high level source voltage VDDL. The second cell library stores information about cells corresponding to domino gates operating on the second high level source voltage VDDH. The details of the second aspect of the present invention are explained by following two steps:

(i) A first step of receiving a Register Transfer Level (RTL) description or a logic description, timing requirements, and data stored in the first and second cell libraries and synthesizes logic functions accordingly. By the first step, a first and a second cell level circuits corresponding to the first and the second cell libraries are generated respectively.

(ii) A second step of replacing the first and the second cell level circuits by domino gates operating on the first and second high level source voltages respectively.

The first and second steps efficiently design a logic circuit that meets given timing requirements and contain a mixture of gates supplied by different high level source voltages.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First embodiment)

Figure 3:
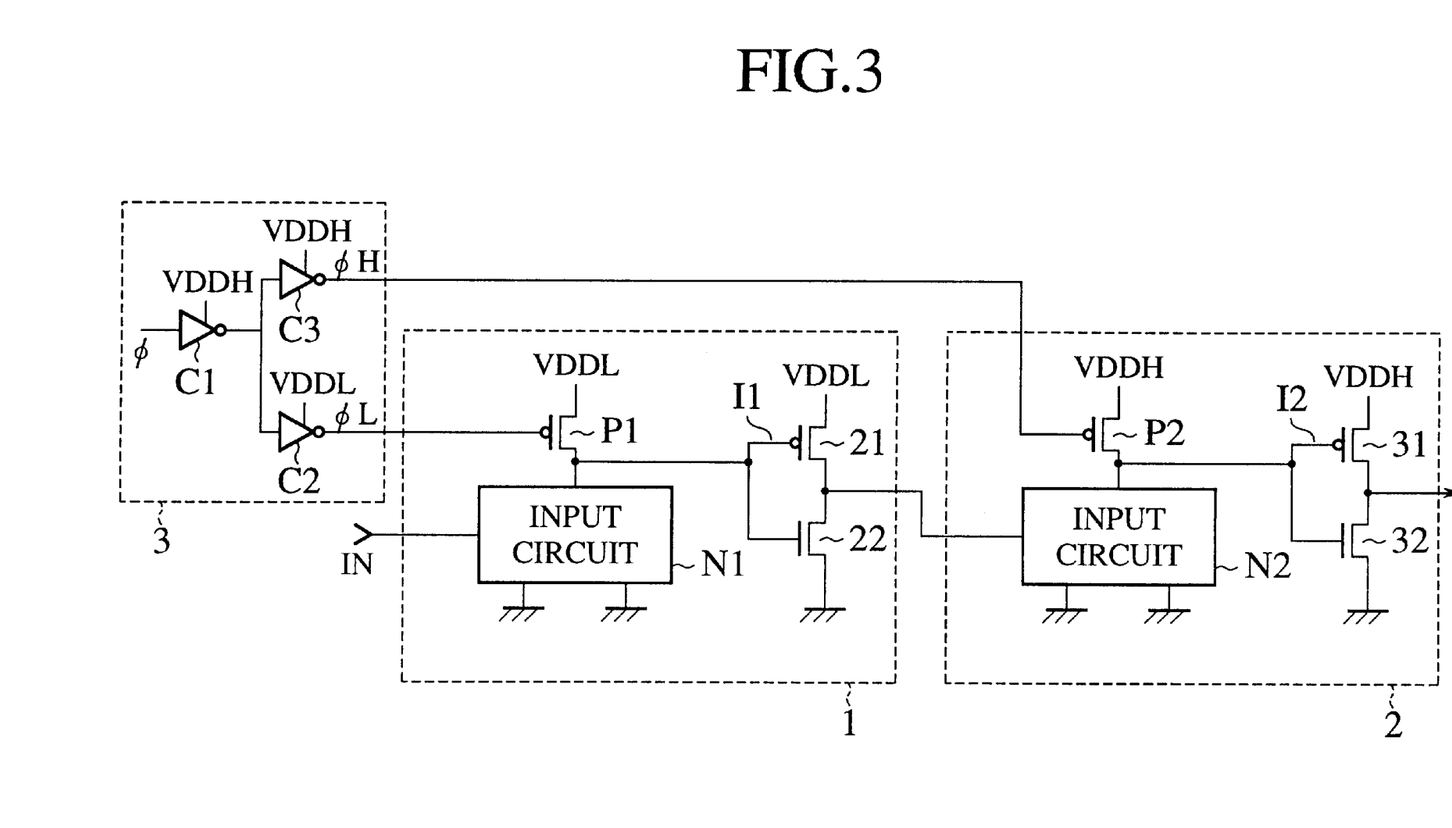
FIG. 3 shows a logic circuit according to a first embodiment of the present invention.

FIG. 3 shows a CMOS logic circuit according to the first embodiment of the present invention. The logic circuit consists of a first logic gate 1 and a second logic gate 2. A domino gate serving as a first logic gate 1 operates between a first high level source voltage VDDL and low level source voltage (GND). Another domino gate serving as a second logic gate 2 operates between a second high level source voltage VDDH and the low level source voltage (GND). The second high level source voltage VDDH is higher than VDDL. The first high level source voltage VDDL is hereinafter simply referred to as VDDL and the second high level source voltage VDDH as VDDH. VDDH is a standard supply voltage, and VDDL is lower than the standard supply voltage and is supplied to selected logic gates, to reduce power dissipation. For example, VDDH is 5 Volts and VDDL is 3 Volts. The logic circuit further has a clock buffer 3 for providing clock signals to the logic gates 1 and 2, respectively. Unlike the prior art, there is no level converter between the logic gates 1 and 2.

The first logic gate 1 consists of a first precharge pMOS P1, a first input circuit N1, and a first CMOS inverter I1. The first precharge pMOS P1 receives VDDL. The first input circuit N1 is arranged between the pMOS P1 and a reference voltage source supplying the low level source voltage (GND), and consists of a combinational circuit having nMOSs to execute a required logic operation by an input signal IN. The first CMOS inverter I1 has an input terminal connected to a node between the pMOS P1 and the input circuit N1. The inverter I1 is a CMOS circuit consisting of a pMOS 21 and an nMOS 22 and operates between VDDL and GND. The input terminal of the inverter I1 is so formed as to connect the both gates of the pMOS 21 and nMOS 22. A node between the drains of the pMOS 21 and nMOS 22 serves as an output terminal of the first logic gate 1.

The second logic gate 2 consists of a second precharge pMOS P2, a second input circuit N2, and a second CMOS inverter I2. The second precharge pMOS P1 receives VDDH. The second input circuit N2 is arranged between the pMOS P2 and the reference voltage source supplying the low level source voltage (GND). The input circuit N2 consists of a combinational circuits having nMOSs to execute a logic operation by an output signal of the gate 1. The inverter I2 is a CMOS inverter consisting of a pMOS 31 and an nMOS 32 and operates on VDDH. An input terminal of the inverter I2 is so formed as to connect the both gates of the pMOS 31 and nMOS 32, and a node between the drains of the pMOS 31 and nMOS 32 serves as an output terminal of the second logic gate 2.

The clock buffer 3 consists of a first, second and third inverters C1, C2, and C3. The first inverter C1 supplied with VDDH receives a reference clock signal φ and inverts the same. The second inverter C2 is supplied with VDDL and inverts the output of the first inverter C1, to provide the pMOS P1 with a clock signal φ L. The third inverter C3 is supplied with VDDH and inverts the output of the first inverter C1, to provide the pMOS P2 with a clock signal φ H.

Figure 4A:
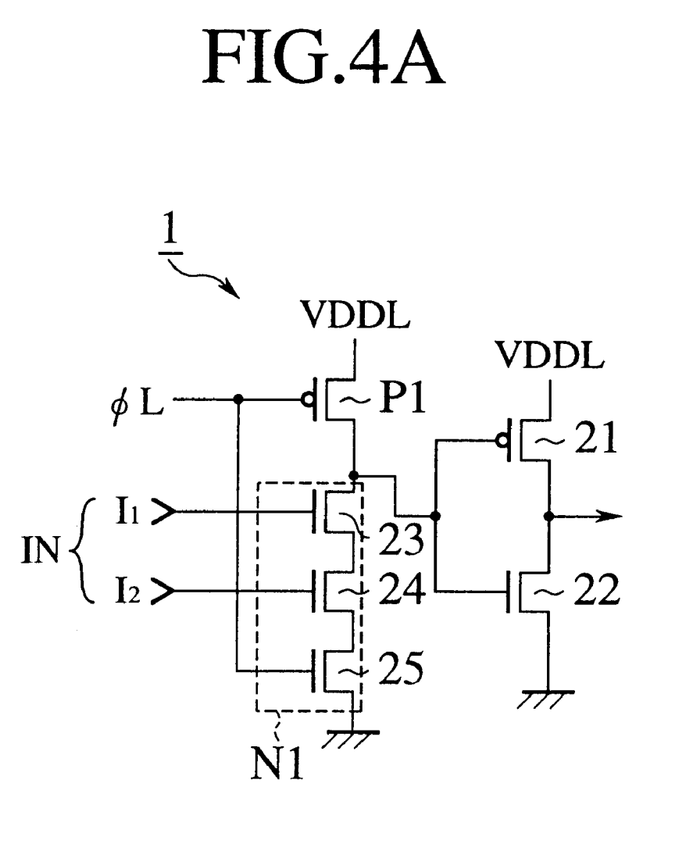
FIGS. 4A and 4B show domino gates operating on a first high level source voltage VDDL according to the present invention.
Figure 4B:
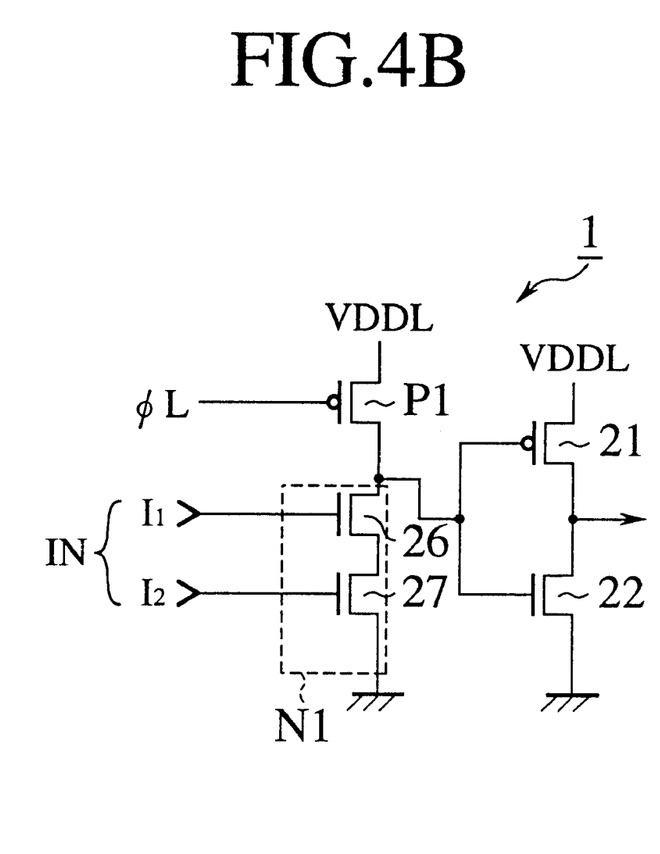
Figure 5A:
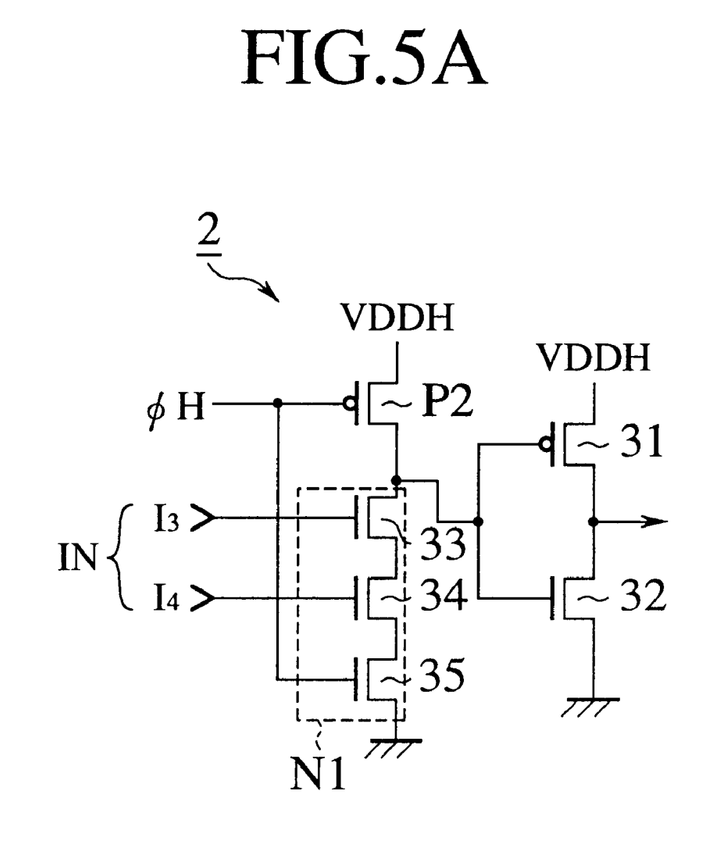
FIGS. 5A and 5B show domino gates operating on a second high level source voltage VDDH according to the present invention.
Figure 5B:
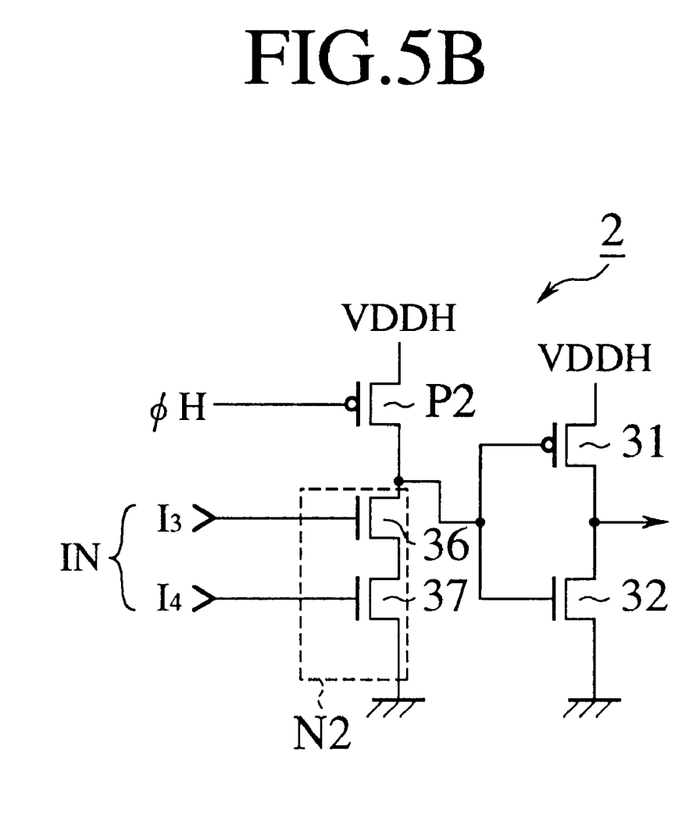

FIG. 4A shows an AND domino gate as an example of the first logic gate 1. The first input circuit N1 of this example has nMOSs 23, 24, and 25 connected in series. The nMOSs 23 and 24 receive input signals I1 and I2, respectively, and the nMOS 25 receives the clock signal φ L. FIG. 4B shows another AND domino gate as an example of the first logic gate 1 with the first input circuit N1 consisting of nMOSs 26 and 27 connected in series. This example is not provided with the nMOS 25 of FIG. 4A. FIG. 5A shows an AND domino gate as an example of the second logic gate 2. The second input circuit N2 of this example has nMOSs 33, 34, and 35 connected in series. The nMOSs 33 and 34 receive input signals I3 and I4, respectively, and the nMOS 35 receives the clock signal φ H. FIG. 5B shows another AND domino gate as an example of the second logic gate 2 with the input circuit N2 having nMOSs 36 and 37 connected in series. This example is not provided with the nMOS 35 of FIG. 5A.

The logic gates of FIGS. 4A and 5A generate no short-circuit current during a precharge operation without regard to the levels of the input signals thereto. Accordingly, these logic gates are used in a first stage of a logic circuit. The logic gates of FIGS. 4B and 5B cause no short-circuit current during a precharge operation only if the input signals thereto are each at low level during the precharge operation. Accordingly, these logic gates are arranged behind another domino gate. The domino gates of FIG. 3 provide each a low-level output during a precharge operation. An OR domino gate may be formed by constituting each input circuit (N1, N2) with nMOSs connected in parallel and an nMOS for receiving the clock signal φ H (φ L) at a proper position as shown in FIGS. 4A and 5A.

In FIG. 3, the output of the first logic gate 1 is transmitted to the second input circuit N2 but is not transmitted to the gate of the second precharge pMOS P2. Namely, the gate of the second precharge pMOS P2 is never set to an intermediate voltage VN to cause a short-circuit current passing through the second logic gate 2. Here, Vthn<VN<VDDH−|Vthp|. Accordingly, power dissipation will not increase even if the first logic gate 1 is directly connected to the second logic gate 2 without interposing a level converter between them.

The above effect largely owes to the domino gates serving as the logic gates 1 and 2. The domino gates, however, consume large power in clock wiring. Namely, the domino gates need clock signals, and large power is needed to drive clock wiring. To solve this problem, the present invention provides the logic gate 1 with the clock signal φ L whose high level is defined by the first high level source voltage VDDL. This lower supply voltage of VDDL reduces power dissipation in the clock wiring. In addition, the clock buffer 3 of the present invention employs the single reference clock signal φ to generate the clock signal φ L for the logic gate 1 and the clock signal φ H for the logic gate 2. This further reduces power dissipation in the clock wiring. Namely, the single reference clock signal φ involves simple external clock wiring to reduce load capacitance, thereby minimizing the power dissipation and power consumption.

(Second Embodiment)

Figure 6A:
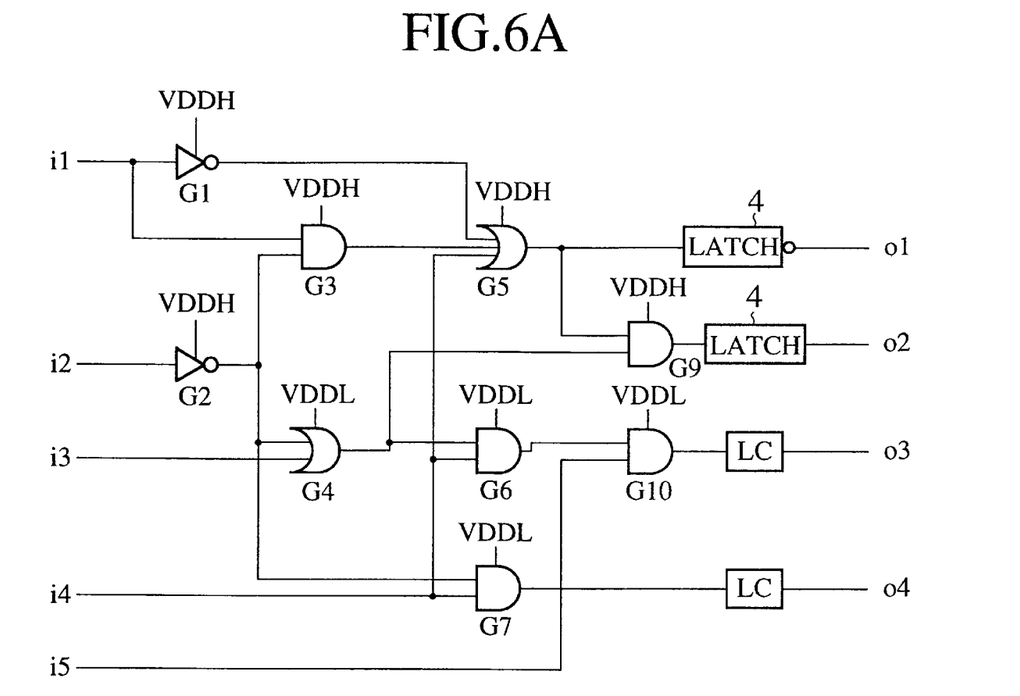
FIG. 6A shows a logic circuit according to a second embodiment of the present invention.
Figure 6B:
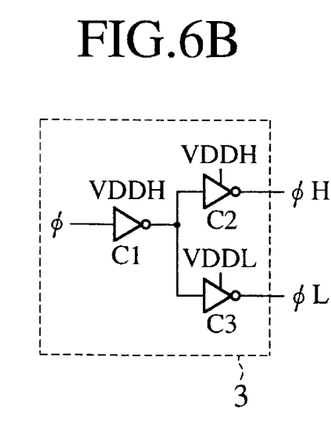
FIG. 6B shows a clock buffer used for the circuit of FIG. 6A.

FIG. 6A shows an example of a random logic circuit employing domino gates according to the second embodiment of the present invention. Gates G2, G3, G5, and G9 are disposed on a critical path, and the other gates included are assumed to be formed on paths having gate delay margins. The prior art of FIG. 2B must arrange a level converter between the gates G1 and G5 and between the gates G4 and G9. To eliminate these level converters, the second embodiment employs domino gates for paths between these gates operating on different supply voltages. It may be possible to design a logic circuit having partly, for specified gates, domino gates synchronously operating with clock signals, but the design methodology is rather complicated and relatively difficult. To avoid cluttering up, the second embodiment forms all gates except the inverter gates G1 and G2 with domino gates. More precisely, the gates G3, G5, and G9 are each made of one of the domino gates 2 of FIGS. 5A and 5B operating on the second high level source voltage VDDH, and the gates G4, G6, G7, and G10 are each made of one of the domino gates of FIGS. 4A and 4B operating on the first high level source voltage VDDL. The gates G1 and G2 operate on VDDH.

Figure 6C:
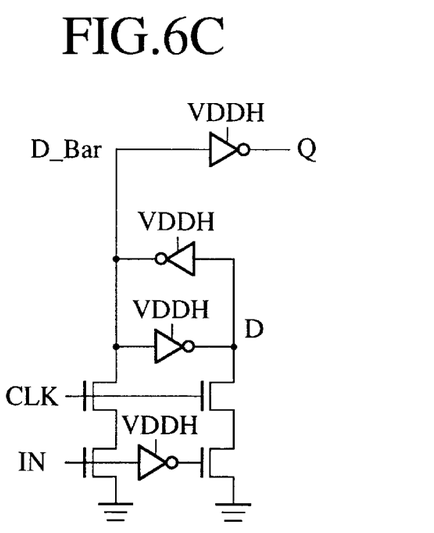
FIG. 6C shows a level-converting latch disposed in the circuit of FIG. 6A.

The logic circuit of FIG. 6A has level-converting latches LC each having a level converting function between output gates G7, G10 and output terminals o3, o4, respectively. Standard latches 4 are disposed between output gates G5, G9 and output terminals o1, o2. These latches should be employed if output signals with a voltage amplitude between a reference voltage (GND) and VDDH are required. FIG. 6C shows a detailed circuit configuration of the level-converting latch LC as an example. This level-converting latch LC carries out level converting and latching operations in synchronization with a clock signal at the same power dissipation as a standard latch. Accordingly, the level-converting latches LC are preferable in reducing power dissipation.

(Third Embodiment)

Figure 7:
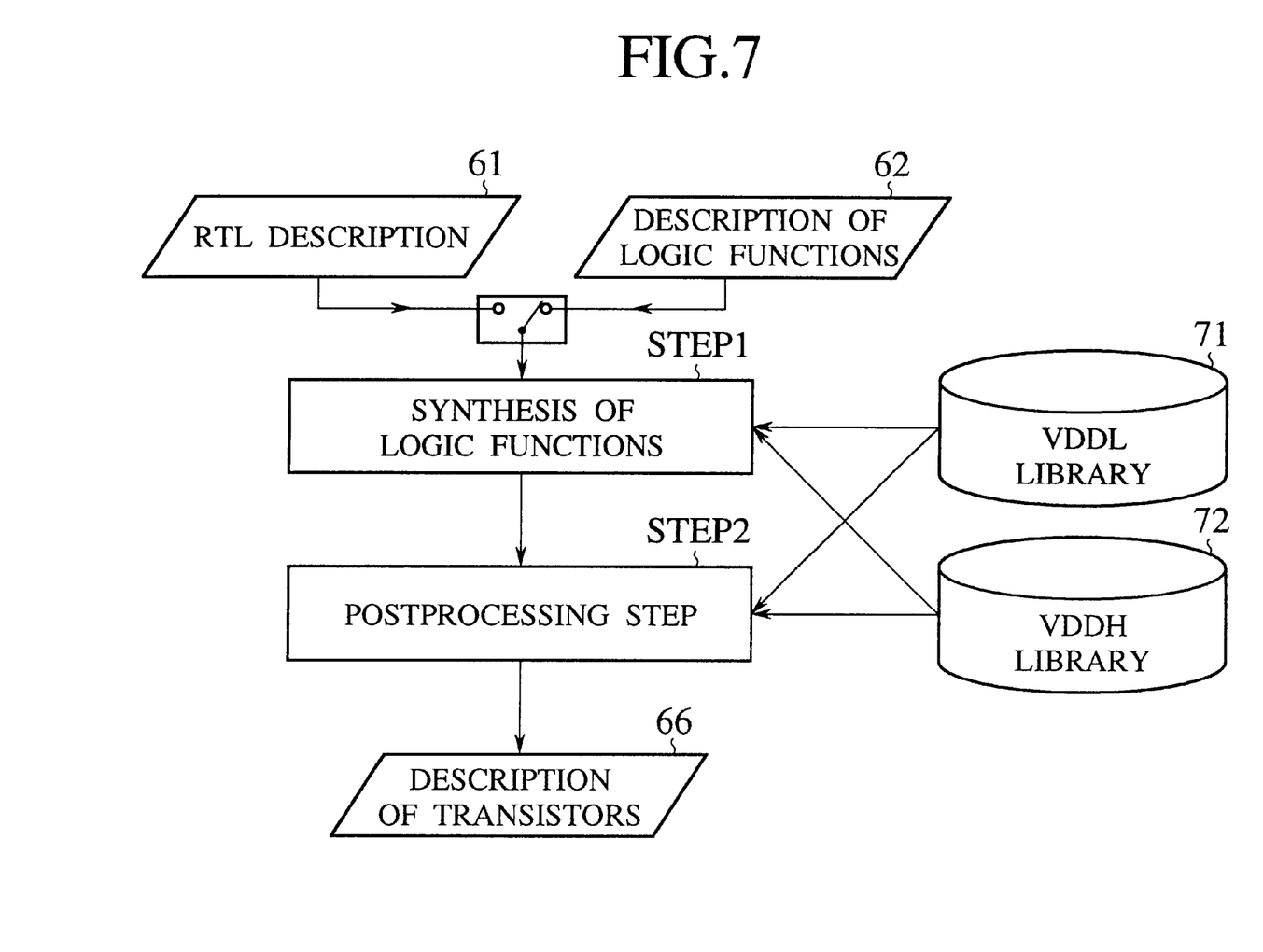
FIG. 7 is a flowchart showing a method of designing a logic circuit according to the present invention.

FIG. 7 is a flowchart showing a method of designing a logic circuit according to the third embodiment of the present invention. The method prepares a VDDL library serving as a third cell library that stores information about the performance of cells operating on the first high level source voltage VDDL, and a VDDH library serving as a second cell library that stores information about the performance of cells operating on the second high level source voltage VDDH. The VDDL library stores data whose cost are inexpensive but relatively poor in performance, and the data contained in the VDDH library are expensive but high in performance. The third embodiment employs the two libraries to synthesize a logic circuit according to timing requirements. After the synthesized logic circuits are generated, each cell, or the cell level circuit corresponding to the VDDL library is replaced by a domino gate operating on VDDL (hereinafter called "the VDDL domino gate"), and each cell corresponding to the VDDH library is replaced by a domino gate operating on VDDH (hereinafter called "the VDDH domino gate"), to obtain a complete circuit description at transistor levels. Any cell that is not involved on a critical path in the logic circuit is realized with a VDDL domino gate by logic synthesis tools, to maximize the number of VDDL domino gates in the logic circuit and minimize the power dissipation of the logic circuit.

In FIG. 7, VDDL library (first cell library) 71 and VDDH library (second cell library) 72 are prepared at first. The VDDL library 71 stores data corresponding to VDDL domino gate. Namely, the VDDL library 71 stores performance data calculated for the VDDL domino gate, in principle. The VDDH library 72 basically stores data corresponding to VDDH domino gate, as a rule.

Step 1 synthesizes logic functions according to a Register Transfer Level (RTL) description 61 or a logic description 62. In the third embodiment of the present invention, the logic description 62 is selected, for example, and following explanation will be based on the logic description 62. The logic description 62 specifies primary inputs i1 to i5, the inversions (i1 to i5) thereof. The arrival timings of the primary inputs, and the timings to be defined on primary outputs o1 to o4 are input to the logic synthesis tools as the timing requirements. In step 1, according to these pieces of timing data and the performance data from the libraries 71 and 72, the logic synthesis tools select proper sets of cells having lower cost, which meet the timing requirement.

Namely, the logic synthesis tools generate a first and a second cell level circuits corresponding to the first and the second cell libraries respectively. In this way, the number of the VDDL cells of low cost is maximized and the cell level circuits which meet the timing requirement are obtained.

Step 2 (postprocessing step) replaces cell configurations obtained in the step 1. Namely, the first cell level circuits selected from the VDDL library 71 are replaced by VDDL domino gates and the second cell level circuits selected from the VDDH library 72 are replaced by VDDH domino gates. And then a complete transistor description 66 is obtained. At this time, any domino gate arranged in a first stage of the logic circuit is selected from those of FIGS. 4A and 5A.

Figure 8:
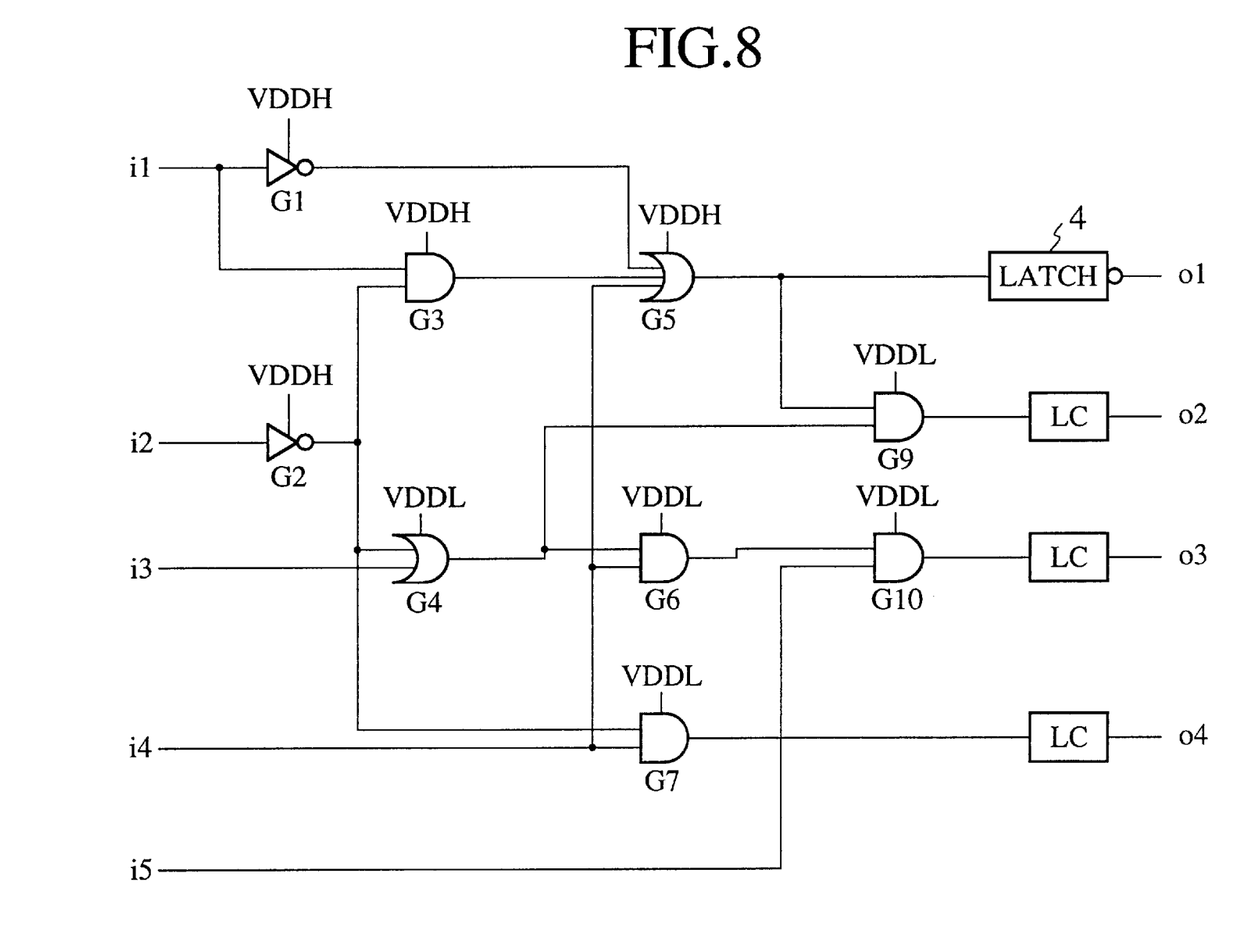
FIG. 8 shows a logic circuit according to a third embodiment of the present invention, designed according to the flowchart of FIG. 7.

FIG. 8 shows a logic circuit designed according to the flowchart of FIG. 7. Unlike the logic circuit of FIG. 6A, a gate G9 of FIG. 8 is a VDDL gate. This is because the gate G9 has a timing margin to allow itself to be a VDDL gate although it is disposed on a critical path. The logic synthesis tools used in the step 1 of FIG. 7 take the gate delay margin into account and maximizes the number of VDDL domino gates when designing the logic circuit. The logic circuit of FIG. 8 is better than that of FIG. 6A because it employs a larger number of VDDL gates.

As explained above, employing a mixture of VDDH and VDDL gates for a CMOS logic circuit is useful to reduce the power dissipation thereof. The art of mixing VDDH and VDDL gates required, in the prior art, a level converter to be arranged between each pair of VDDL and VDDH gates. This has increased power dissipation because the level converters dissipate large power. On the other hand, the third embodiment of the present invention requires no level converter when designing a CMOS logic circuit with VDDH and VDDL gates, thereby greatly reducing power dissipation. In addition, the third embodiment employs the lower supply voltage VDDL to generate a clock signal for the VDDL gates, to reduce power dissipation in clock wiring.

The third embodiment maximizes the number of VDDL gates while satisfying timing requirements when designing a logic circuit having a mixture of VDDL and VDDH gates, thereby reducing the power dissipation of the logic circuit.

(Fourth Embodiment)

Figure 9:
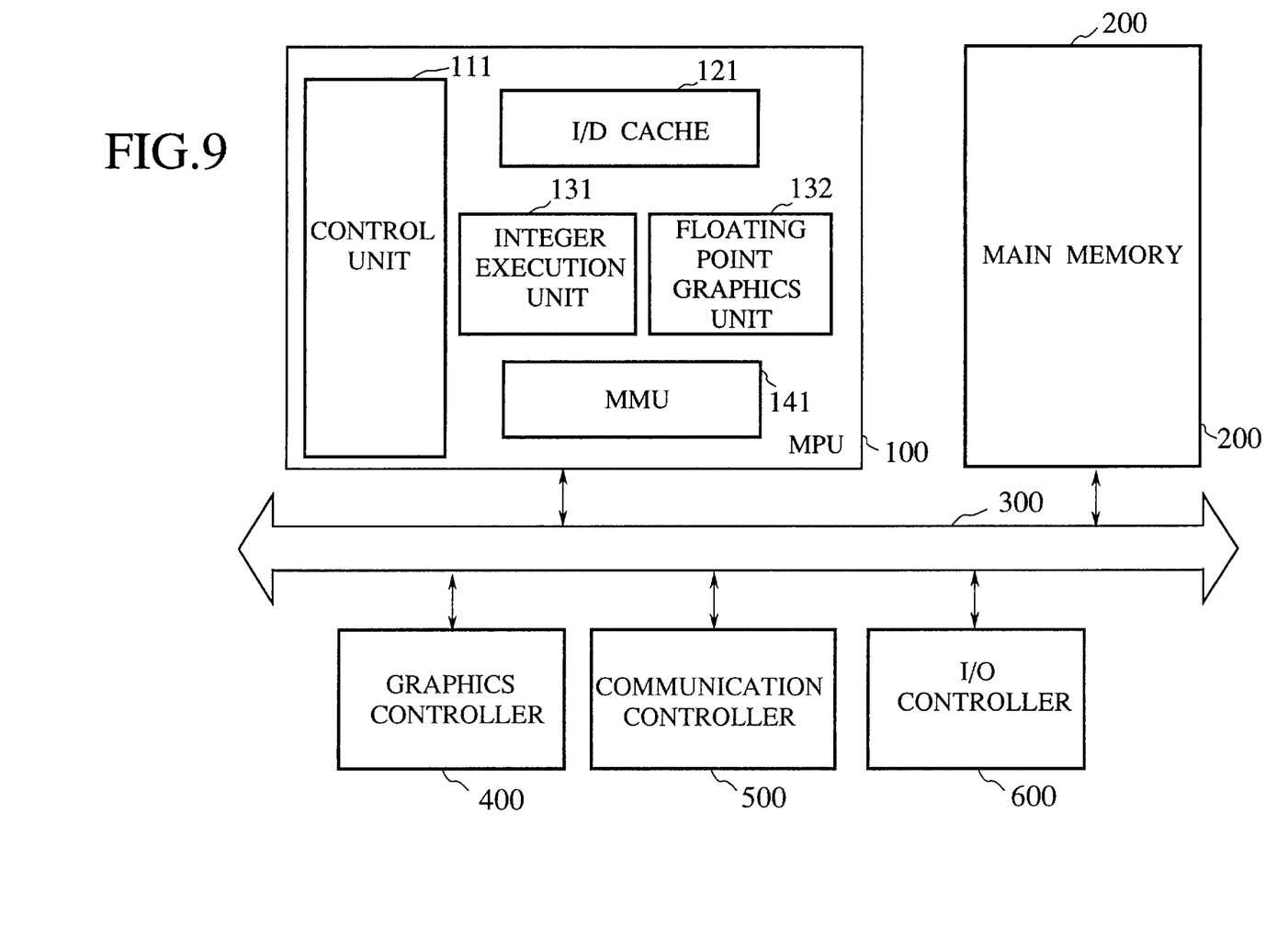
FIG. 9 shows a computer system according to a fourth embodiment of the present invention.

FIG. 9 shows a computer system according to the fourth embodiment of the present invention. The computer system has at least an MPU 100, a main memory 200, a graphics controller 400, a communication controller 500, and an I/O controller 600. These components are connected to one another through a bus 300. The MPU 100 has a control unit 111, an instruction/data cache 121, an integer execution unit 131, a floating point graphics unit 132, and an instruction/data memory management unit (MMU) 141. At least one, preferably every one, of the units 111, 131, and 132 is made of a CMOS logic circuit based on one of the first to third embodiments, to reduce the power dissipation thereof. In the CMOS logic circuit of any one of the units 111, 131, and 132, every logic gate not involved on a critical path operates on VDDL, so that the logic circuit may operate at high speed, cause no short-circuit current, and consume small power. The computer system of the fourth embodiment realizes, therefore, a high-speed operation with low power dissipation and low power consumption. The CMOS logic circuit operating on VDDL and VDDH may easily be designed according to the method explained in the third embodiment (see FIG. 7) so as to maximize the number of logic gates operating on VDDL, while keeping the required timing requirements.

Various modifications will become possible for those skilled in the art after receiving the teachings of the present disclosure without departing from the scope thereof. Although the logic circuit of any one of the first to fourth embodiments employs a mixture of logic gates (domino gates) operating on two different source voltages, this does not limit the present invention. The present invention is applicable to a logic circuit employing a mixture of logic gates operating on three or more different supply voltages. In this case, the logic circuit may have a clock buffer that uses the at least three supply voltages to generate clock signals for the logic gates. To design such a logic circuit, cell libraries having information about the performance of cells operating on the at least three different high level source voltages are prepared. These libraries are used as shown in FIG. 7 to design the logic circuit of low power dissipation with a maximum number of low-voltage-operating logic gates.

What is claimed is:

1. A logic circuit comprising:
   a first domino CMOS logic gate serving as a first logic gate that operates on a first high level source voltage, the first logic gate comprises:
   a first precharge p-channel MOSFET connected to the first high level source voltage;
   a first input circuit which includes n-channel MOSFETs, arranged between and connected to the first precharge p-channel MOSFET and a reference voltage source; and
   a first CMOS inverter connected to the first high level source voltage, having an input terminal connected to a node between the first precharge p-channel MOSFET and the first input circuit; and
   a second domino CMOS logic gate serving as a second logic gate that operates on a second high level source voltage that is higher than the first high level source voltage, an output of the first logic gate is fed to the second logic gate, the second logic gate comprises:
   a second precharge p-channel MOSFET connected to the second high level source voltage;
   a second input circuit which includes n-channel MOSFETs, arranged between and connected to the second precharge p-channel MOSFET and a reference voltage source; and
   a second CMOS inverter connected to the second high level source voltage, having an input terminal connected to a node between the second precharge p-channel MOSFET and the second input circuit.

2. The logic circuit of claim 1, further comprising a level-converting latch having a level converting function, connected to an output terminal of the first logic gate.

3. A logic circuit comprising:
   a first domino CMOS logic gate serving as a first logic gate that operates on a first high level source voltage; and
   a second domino CMOS logic gate serving as a second logic gate that operates on a second high level source voltage that is higher than the first high level source voltage an output of the first logic gate is fed to the second logic gate; and
   a clock buffer for generating, according to a reference clock signal, a first clock signal whose high level is defined by the first high level source voltage and a second clock signal whose high level is defined by the second high level source voltage, the first logic gate being provided with the first clock signal and the second logic gate being provided with the second clock signal.

4. The logic circuit of claim 3, wherein the first logic gate comprises:

a first precharge p-channel MOSFET;
a first input circuit arranged between and connected to the first p-channel MOSFET and a reference voltage source; and
a first CMOS inverter having an input terminal connected to a node between the first p-channel MOSFET and the first input circuit.

5. The logic circuit of claim 3, wherein the second logic gate comprises:
   a second precharge p-channel MOSFET;
   a second input circuit arranged between and connected to the second p-channel MOSFET and a reference voltage source; and
   a second CMOS inverter having an input terminal connected to a node between the second p-channel MOSFET and the second input circuit.

6. The logic circuit of claim 3, wherein the clock buffer comprises:
   a first inverter for receiving the reference clock signal;
   a second inverter connected to the first inverter and being supplied with the first high level source voltage, to generate the first clock signal; and
   a third inverter connected to the first inverter and being supplied with the second high level source voltage, to generate the second clock signal.

7. A logic circuit comprising:
   a first domino CMOS logic gate serving as a first logic gate that operates on a first high level source voltage; and
   a second domino CMOS logic gate serving as a second logic gate that operates on a second high level source voltage that is higher than the first high level source voltage, an output of the first logic gate is fed to the second logic gate; and
   a clock buffer for generating, according to a reference clock signal, a first clock signal whose high level is defined by the first high level source voltage and a second clock signal whose high level is defined by the second high level source voltage, the first logic gate receives the first clock signal and the second logic gate receives the second clock signal.

8. The logic circuit of claim 7, wherein the first logic gate comprises:
   a first precharge p-channel MOSFET;
   a first input circuit arranged between and connected to the first p-channel MOSFET and a reference voltage source; and
   a first CMOS inverter having an input terminal connected to a node between the first p-channel MOSFET and the first input circuit.

9. The logic circuit of claim 8, wherein the first input circuit comprises:
   a first n-channel MOSFET connected to the first precharge p-channel MOSFET; and
   a second n-channel MOSFET arranged between and electrically coupled with the first n-channel MOSFET and the reference voltage source.

10. The logic circuit of claim 9, further comprising a fifth n-channel MOSFET arranged between and connected to the second n-channel MOSFET and the reference voltage source.

11. The logic circuit of claim 7, wherein the clock buffer comprises:
   a first inverter for receiving the reference clock signal;

a second inverter connected to the first inverter and being supplied with the first high level source voltage, to generate the first clock signal; and a third inverter connected to the first inverter and being supplied with the second high level source voltage, to generate the second clock signal.

12. The logic circuit of claim 7, wherein the second logic gate comprises:

a second precharge p-channel MOSFET;

a second input circuit arranged between and connected to the second p-channel MOSFET and a reference voltage source; and a second CMOS inverter having an input terminal connected to a node between the second p-channel MOSFET and the second input circuit.

13. The logic circuit of claim 12, wherein the second input circuit comprises:

a third n-channel MOSFET connected to the second precharge p-channel MOSFET; and a fourth n-channel MOSFET arranged between and electrically coupled with the third n-channel MOSFET and the reference voltage source.

14. The logic circuit of claim 13, further comprising a sixth n-channel MOSFET arranged between and connected to the fourth n-channel MOSFET and the reference voltage source.

15. A computer system having a microprocessor unit, a bus connected to the microprocessor unit, a main memory connected to the bus, a graphics controller connected to the bus, a communication controller connected to the bus, and an I/O controller connected to the bus, the microprocessor unit having a control unit, an instruction/data cache, an integer execution unit, a floating point graphics unit, and a memory management unit, at least one of the control unit, integer execution unit, and floating point graphics unit comprising:

a first domino CMOS logic gate serving as a first logic gate that operates on a first high level source voltage, the first logic gate comprises a first CMOS inverter connected to the first high level source voltage; and a second domino CMOS logic gate serving as a second logic gate that operates on a second high level source voltage that is higher than the first high level source voltage, the second logic gate comprises:

a precharge p-channel MOSFET connected to the second high level source voltage;

an input circuit, an output of the first CMOS inverter being fed to the input circuit, which includes n-channel MOSFETs, arranged between and connected to the precharge p-channel MOSFET and a reference voltage source; and a second CMOS inverter connected to the second high level source voltage, having an input terminal connected to a node between the precharge p-channel MOSFET and the input circuit.

16. A logic circuit comprising:

a first domino CMOS logic gate serving as a first logic gate that operates on a first high level source voltage; and a second domino CMOS logic gate serving as a second logic gate that operates on a second high level source voltage that is higher than the first high level source voltage, and output of the first logic gate is fed to the second logic gate, the second logic gate comprises:

a precharge p-channel MOSFET;

an input circuit arranged between and connected to the precharge p-channel MOSFET and a reference voltage source; and a CMOS inverter having an input terminal connected to a node between the precharge p-channel MOSFET and the input circuit.

17. A microprocessor unit having a control unit, an instruction/data cache, an integer execution unit, a floating point graphics unit, and a memory management unit, at least one of the control unit, integer execution unit, and floating point graphics unit comprising:

a first domino CMOS logic gate serving as a first logic gate that operates on a first high level source voltage, the first logic gate comprises:

a first precharge p-channel MOSFET connected to the first high level source voltage;

a first input circuit which includes n-channel MOSFETs, arranged between and connected to the first precharge p-channel MOSFET and a reference voltage source; and a first CMOS inverter connected to the first high level source voltage, having an input terminal connected to a node between the first precharge p-channel MOSFET and the first input circuit; and a second domino CMOS logic gate serving as a second logic gate that operates on a second high level source voltage that is higher than the first high level source voltage, an output of the first logic gate being fed to the second logic gate, the second logic gate comprises:

a second precharge p-channel MOSFET connected to the second high level source voltage;

a second input circuit which includes n-channel MOSFETs, arranged between and connected to the second precharge channel MOSFET and a reference voltage source; and a second CMOS inverter connected to the second high level source voltage, having an input terminal connected to a node between the second precharge p-channel MOSFET and the second input circuit.

18. A computer system having a microprocessor unit, a bus connected to the microprocessor unit, a main memory connected to the bus, a graphics controller connected to the bus, a communication controller connected to the bus, and an I/O controller connected to the bus, the microprocessor unit having a control unit, an instruction/data cache, an integer execution unit, a floating point graphics unit, and a memory management unit, at least one of the control unit, integer execution unit, and floating point graphics unit comprising:

a first domino CMOS logic gate serving as a first logic gate that operates on a first high level source voltage, the first logic gate comprises:

a first precharge p-channel MOSFET connected to the first high level source voltage;

a first input circuit which includes n-channel MOSFETs, arranged between and connected to the first precharge p-channel MOSFET and a reference voltage source; and a first CMOS inverter connected to the first high level source voltage, having an input terminal connected to a node between the first precharge p-channel MOSFET and the first input circuit; and a second domino CMOS logic gate serving as a second logic gate that operates on a second high level source voltage that is higher than the first high level source voltage, an output of the first logic gate being fed to the second logic gate, the second logic gate comprises:

a second precharge p-channel MOSFET connected to the second high level source voltage;

a second input circuit which includes n-channel MOSFETs, arranged between and connected to the second precharge p-channel MOSFET and a reference voltage source; and a second CMOS inverter connected to the second high level source voltage, having an input terminal connected to a node between the second precharge p-channel MOSFET and the second input circuit.

19. A logic circuit comprising:

a first domino CMOS logic gate serving as a first logic gate that operates on a first high level source voltage, the first logic gate comprises a first CMOS inverter connected to the first high level source voltage; and a second domino CMOS logic gate serving as a second logic gate that operates on a second high level source voltage that is higher than the first high level source voltage, the second logic gate comprises:

a precharge p-channel MOSFET connected to the second high level source voltage;

an input circuit, an output of the first CMOS inverter being fed to the input circuit, which includes n-channel MOSFETs, arranged between and connected to the precharge p-channel MOSFET and a reference voltage source; and a second CMOS inverter connected to the second high level source voltage, having an input terminal connected to a node between the precharge p-channel MOSFET and the input circuit.

20. The logic circuit of claim 19, wherein the input circuit is an AND circuit comprising n-channel MOSFETs connected in series.

21. A microprocessor unit having a control unit, an instruction/data cache, an integer execution unit, a floating point graphics unit, and a memory management unit, at least one of the control unit, integer execution unit, and floating point graphics unit comprising:

a first domino CMOS logic gate serving as a first logic gate that operates on a first high level source voltage, the first logic gate comprises a first CMOS inverter connected to the first high level source voltage; and a second domino CMOS logic gate serving as a second logic gate that operates on a second high level source voltage that is higher than the first high level source voltage, the second logic gate comprises:

a precharge p-channel MOSFET connected to the second high level source voltage;

an input circuit, an output of the first CMOS inverter being fed to the input circuit, which includes n-channel MOSFETs, arranged between and connected to the precharge p-channel MOSFET and a reference voltage source; and a second CMOS inverter connected to the second high level source voltage, having an input terminal connected to a node between the precharge p-channel MOSFET and the input circuit.

* * * * *